United States Patent [19]

Tada et al.

[11] Patent Number: 5,145,550

[45] Date of Patent: Sep. 8, 1992

[54] PROCESS AND APPARATUS FOR GROWING SINGLE CRYSTALS OF III-V COMPOUND SEMICONDUCTOR

[75] Inventors: Koji Tada; Masami Tatsumi, both of Osaka, Japan

[73] Assignee: Sumitomo Electric Industries, Ltd., Osaka, Japan

[21] Appl. No.: 38,447

[22] Filed: Apr. 14, 1987

Related U.S. Application Data

[63] Continuation of Ser. No. 703,740, Feb. 21, 1985, abandoned.

[30] Foreign Application Priority Data

Feb. 21, 1984 [JP] Japan ............... 59-31146

[51] Int. Cl.$^5$ ............... C30B 27/02
[52] U.S. Cl. ............... 156/605; 156/607; 156/620.2; 156/620.5; 156/DIG. 70; 156/DIG. 83
[58] Field of Search ............... 156/605, 607, 617 SP, 156/DIG. 70, DIG. 81, DIG. 84, DIG. 93, 620.2, 620.5; 422/249

[56] References Cited

U.S. PATENT DOCUMENTS

| | | | |
|---|---|---|---|
| 3,002,824 | 10/1961 | Francois | 422/249 X |
| 3,198,606 | 8/1965 | Lyons | 156/617 SP X |
| 3,741,817 | 6/1973 | Bienert et al. | 156/605 |
| 4,352,784 | 10/1982 | Lin | 422/249 |
| 4,478,675 | 10/1984 | Akai | 156/607 X |
| 4,528,061 | 7/1985 | Miyazawa et al. | 156/607 X |
| 4,664,742 | 5/1987 | Tomizawa et al. | 156/607 |

FOREIGN PATENT DOCUMENTS

| | | | |
|---|---|---|---|
| 2245250 | 9/1972 | Fed. Rep. of Germany | 156/617 SP |
| 59-8695 | 1/1984 | Japan | 422/249 |
| 59-13480 | 3/1984 | Japan . | |
| 996008 | 6/1965 | United Kingdom | 156/607 |

OTHER PUBLICATIONS

RADC-TR-86, Technical Report, Study Czochralski Liquid-Seal Crystal Growing Technique, Apr. 1979 (Kennedy et al.).

AuCoin et al; Liquid Encapsulated Compounding and Czochralski Growth of Semi-Insulating Gallium Arsenide; Solid State Tech. vol. 22 No. 1 Jan. 1979 pp. 59-62,67.

Primary Examiner—R. Bruce Breneman
Attorney, Agent, or Firm—Kerkam, Stowell, Kondracki & Clarke

[57] ABSTRACT

A process for growing single crystals of the III-V compound semiconductor is provided, which is the vapor pressure control method using a vertical puller and which is characterized by dividing the surface area of the melt into two sections, covering one section with a liquid encapsulant while remaining the other section in contact with the atmosphere of the vessel (furnace), and this process may be preferably carried out by using an apparatus which comprises a sealable vessel, an upper shaft, a lower shaft, a plurality of heaters, a crucible and a means for dividing the surface of melt contained in the crucible, and as a result single crystal of III-V compound semiconductor having various excellent properties such as low impurity content (high purity), low dislocation density, and the like may be obtained.

1 Claim, 3 Drawing Sheets

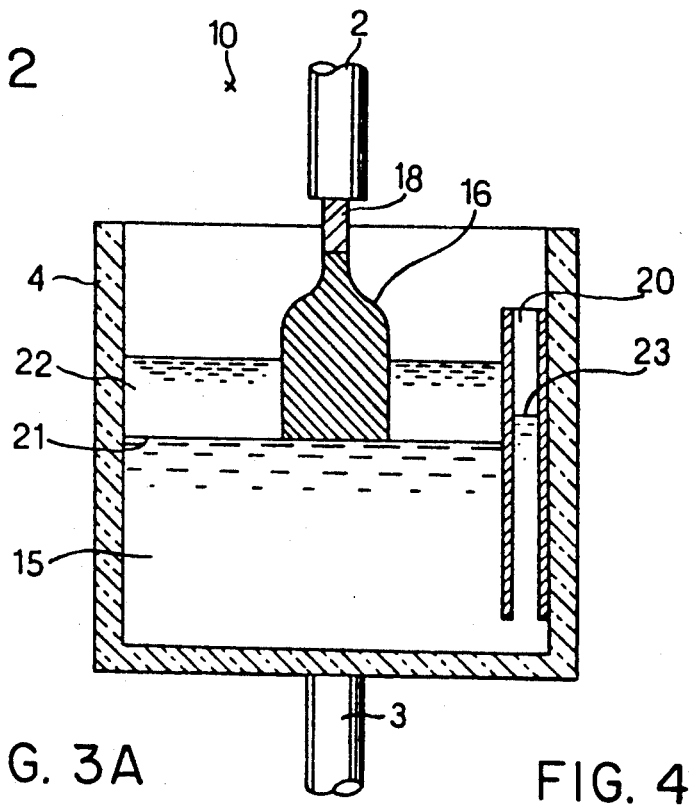
FIG. 2
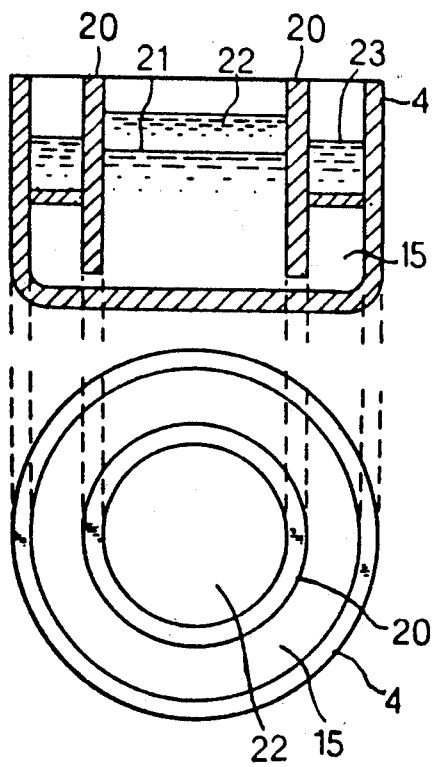
FIG. 3A
FIG. 3B
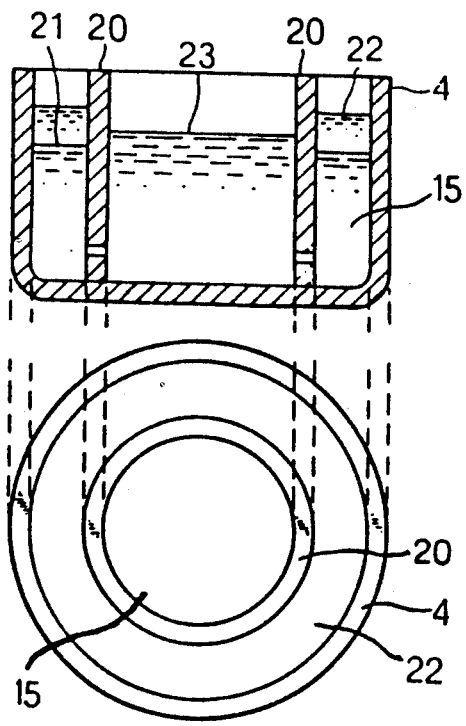
FIG. 4A
FIG. 4B

PROCESS AND APPARATUS FOR GROWING SINGLE CRYSTALS OF III-V COMPOUND SEMICONDUCTOR

This is a continuation of applicatioin Ser. No. 703,740, filed Feb. 21, 1985, now abandoned.

FIELD OF THE INVENTION

The present invention relates to a process for preparing single crystals, more particularly to a process for preparing single crystals of III-V compound semiconductors and an apparatus for growing the single crystal.

DESCRIPTION OF THE PRIOR ART

Recently, there is a great need for high speed and high functional semiconductor devices in such a field of electronics and optoelectronics. Among others, the III-V compound semiconductors draw great attention because of high mobility. Their mobility is 5 or 6 fold higher than that of Si.

Then, they are quite useful as a substrate for integrated circuits (IC) and various kinds of sensors and a material for the light emitting diode, laser diode or the like.

In order to produce a III-V compcund semiconductor device, it is generally necessary to prepare n-type, p-type, and semi-insulating (doped or non-doped) single crystals thereof and such single crystal should have the best quality such as high purity and low dislocation density.

With regard to the III-V compound semiconductors, it is well known that the elements of group V have a high dissociation pressure (for instance, As vapor pressure at the melting point is about 1 atm.) and that there is a great difficulty to maintain the precise composition (stoichiometry of the crystal) during the single crystal growth. Therefore, it is quite important to avoid loss of group V elements from the melt during the growth operation.

Consequently, the growth or the formation of the single crystal of III-V compound semiconductor having such a high dissociation pressure is preferably carried out by a method in which the crystal is grown under a well controlled atmospheric pressure so as to suppress the evaporation of the volatile component.

To date, several kinds of methods for obtaining the best quality single crystals of the compound semiconductor have been proposed and extensively used. For example, the horizontal Bridgemann method and liquid encapsulated Czochralski method (LEC) are well known. The former comprises charging ingredients (for instance Ga and As) into a quartz boat; encapsulating the boat in one chamber of a quartz tube which is divided into two chambers by a diffusion barrier and which is divided into two or three different temperature regions, while charging solid As in the other chamber of the tube; applying heat to the tube to establish a desired temperature distribution in the tube and slowly moving the boat from the high temperature region to the low temperature region to make single crystal grow. In accordance with this process, the precise control of the stoichiometry is possible and the single crystal of low dislocation density is obtained. However, there are some disadvantages such that the form of the crystal is restricted to that of the boat (generally semi-cylindrical) and that a large amount of impurity Si originated from the boat is introduced into the crystal.

Another effective method, namely, the liquid encapsulated Czochralski (LEC) method comprises introducing melt of ingredients and desired impurities according to need in a crucible of boron nitride, vitreous carbon, quartz, alumina or alminum nitride, which is placed in a high pressure vessel; encapsulating the melt with an encapsulant such as $B_2O_3$ and pulling a seed crystal which is in contact with the melt through the encapsulant, under a high pressure applied to the vessel to avoid the escape of group V element from the melt.

According to the LEC method, the following excellent effect may be expected. Firstly, semi-insulating single crystals can be obtained without doping impurities and when $B_2O_3$ is used as the encapsulant (in the case of GaAs single crystal growth), impurity elements may be captured by $B_2O_3$ and the resulting grown crystal has a quite high purity. In addition, the LEC method provides ingots of circular section since the LEC method is one of the vertical type growth system. Such ingots having circular section provides circular wafers in a high yield and furthermore, the inner walls of the vessel are not polluted with poisonous gases such as As.

On the contrary, the LEC method also has a lot of disadvantages as follows. In the LEC puller, the heating is applied simply around the crucible by a heater and the rest of the vessel remains at a relatively low temperature by, for example, water-cooling of the vessel wall. In addition, $B_2O_3$ has low thermal conductivity and acts as a heat-insulator. Such being the case, a sharp temperature gradient may be established around the solid-liquid interface of the growing crystal, and consequently, great thermal stress remains in the grown crystal during cooling the pulled crystal, which causes the formation of great deal of the defects and which, particularly, makes its dislocation density higher. Furthermore, the pulled crystal does not have a composition which is consistent with the desired stoichiometry since it is difficult to completely avoid the loss of group V element even if the melt of the crystal ingredients is encapsulated with a liquid encapsulant. Therefore, the best quality single crystal is hardly prepared according to such a conventional LEC method.

Another vertical type growth system is known, in which the vapor pressure control method is carried out. The method is characterized in that not only the neighbour of the crucible but the entire vessel are heated to make the temperature gradient along the vertical direction thereof slower and that the group V element is placed in the vessel so as to equilibrate the partial pressure thereof with the dissociation pressure of the melt. Thus, the major problem to be solved, in order to obtain the best quality single crystal of the compound semiconductor, may be eliminated by controlling the temperature distribution and maintaining the desired vapor pressure of the group V element in the vessel.

Since the method is the pull method, the single crystal may be obtained by dipping the seed crystal in the melt and pulling it while rotating the pull rod and the melt (or crucible) in opposite directions. On the contrary, the inner pressure of the vessel is not high but is equal to about 1 atm. and the upper portion (surface) of the melt is free and in contact with the gas atmosphere of the group V element in the vessel so that the dissociation pressure of the melt is consistent with the partial pressure of group V element in the vessel.

In addition, RADC-TR-79-86, "Study Czochralski LiquidSeal Crystal Growing Technique", John K. Kennedy et al., April 1979 discloses a vapor pressure control method which comprises charging a small amount of $B_2O_3$ in a crucible so as to cover a part of the melt surface after completely melting the ingredient and pulling the single crystal from the portion of the melt which is not covered with $B_2O_3$. According to this process it is possible to enjoy the impurity capture effect of $B_2O_3$. The amount of $B_2O_3$ is selected so that the melt surface would come in contact with the gas atmosphere of the group V element at the time of direct reaction of Ga with As and during growth. However, the adjustment of the amount of $B_2O_3$ to be loaded on the melt surface is very difficult and it needs a quite delicate operation. When $B_2O_3$ is used in excess amount, it is impossible to assure the contact between the melt and the As gas atomsphere since the whole surface of the melt is covered with $B_2O_3$.

Furthermore, Japanese Patent Publication No. 13480/1984 discloses a method for growing single crystals of a compound semiconductor having a high dissociation pressure, which is characterized by pulling the crystal under the conditions of double liquid encapsulation, and an apparatus for growing the single crystal in which as in the case of John K. Kennedy et al., the top of the melt in a crucible is covered with $B_2O_3$ to avoid the evaporation loss of the volatile component such as As, as well as to eliminate detrimental effects on the crystal growth, which are caused by $B_2O_3$ dropping from the upper sealed portion. This method makes it possible to prevent the dissociation of the grown crystal, but it is difficult to precisely control the composition of the melt since the whole surface of the melt is covered with $B_2O_3$.

SUMMARY OF THE INVENTION

The disadvantages encountered in the above mentioned prior arts are thought to result from the fact that in vertical vapor pressure control method, the melt is not covered with a liquid encapsulant and consequently the impurity capture effect of $B_2O_3$ cannot be expected, while in the liquid encapsulated Czochralski method, the melt may completely be covered by $B_2O_3$ and therefore the contact of the melt with As atmosphere is impossible, that is, the equilibration of the partial pressure of the volatile component with the dissociation pressure of the melt cannot be established.

The inventors of this application have deeply investigated ways to solve such problems encountered in the single crystal growth technique and found that these disadvantages can be overcome by partially covering the melt surface with a liquid encapsulant and keeping the residual melt surface in contact with the As gas atmosphere in the vessel. This invention is based on such findings.

The principal object of this invention is to provide a process for preparing the best quality single crystal of a compound semiconductor, particularly III-V compound semiconductor, which includes a component of considerably high dissociation pressure (group V element).

Another object of this invention is to provide an apparatus for growing such a single crystal mentioned above.

A further object of this invention is to provide such a single crystal of the III-V compound semiconductor having excellent crystallographic and/or electric properties.

BRIEF DESCRIPTIION OF THE DRAWINGS

FIG. 2 shows a longitudinal section of the crucible equipped with a dividing means as an embodiment of this invention;

FIGS. 3(a) and 3(b) are a longitudinal sectional view and plan view of the crucible respectively, as another embodiment of this invention;

FIGS. 4(a) and 4(b) are similar to FIGS. 3(a) and 3(b) but showing a third embodiment of the invention.

FIGS. 5(a)–5(d) are similar to FIGS. 3(a) and 4(b), but showing another embodiment of the invention.

DETAILED EXPLANATION OF THE INVENTION

The process for preparing single crystals of III-V compound semiconductor according to the present invention comprises pulling a seed crystal which is in contact with the melt of starting materials contained in a crucible placed in a sealable vessel under the gas atmosphere of a group V element evaporated, which is a component of the crystal, characterized by, during growing the single crystal, covering a part of the melt surface with a liquid encapsulant, while maintaining the rest thereof in contact with the gas atmosphere.

The III-V compound semiconductor such GaAs, GaP, InP, InAs, InSb, GaSb may be applicable to the process of this invention. In addition, ternary or higher III-V compound semiconductors are also applicable to the process.

The process may be carried out by utilizing, for example, an apparatus for growing single crystals according to the invention. The apparatus comprises a tight sealable vessel; a crucible placed in the vessel; an upper shaft (or pull rod) for pulling and rotating the growing single crystal, said upper shaft being inserted in the vessel through a hole provided at the top portion of said vessel; a lower shaft for supporting and rotating the crucible together with the melt of starting materials contained therein, the lower shaft being inserted into the vessel through a hole provided at the lowest portion of the vessel and a plurality of heaters mounted to surround the vessel along its height to ensure the desired temperature distribution in the entire vessel, said apparatus being characterized by further comprising a means for dividing the space in the crucible into two parts, which consequently acts as a means for dividing the surface of the melt into two sections, so that one section is covered with a liquid encapsulant and the other section is directly in contact with the atmosphere in the vessel during the crystal growth.

In the apparatus of this invention, the material for the vessel, the crucible and the dividing neans is selected from the group consisting of quartz, vitreous carbon, BN, AlN, SiC or those coated with pBN (pyrolytic boron nitride) or BN.

The process and the apparatus according to the invention will now be explained more in detail, referring to the attached drawings, in comparison to the conventional vapor pressure control method wherein a vertical puller is used.

Figure 1:
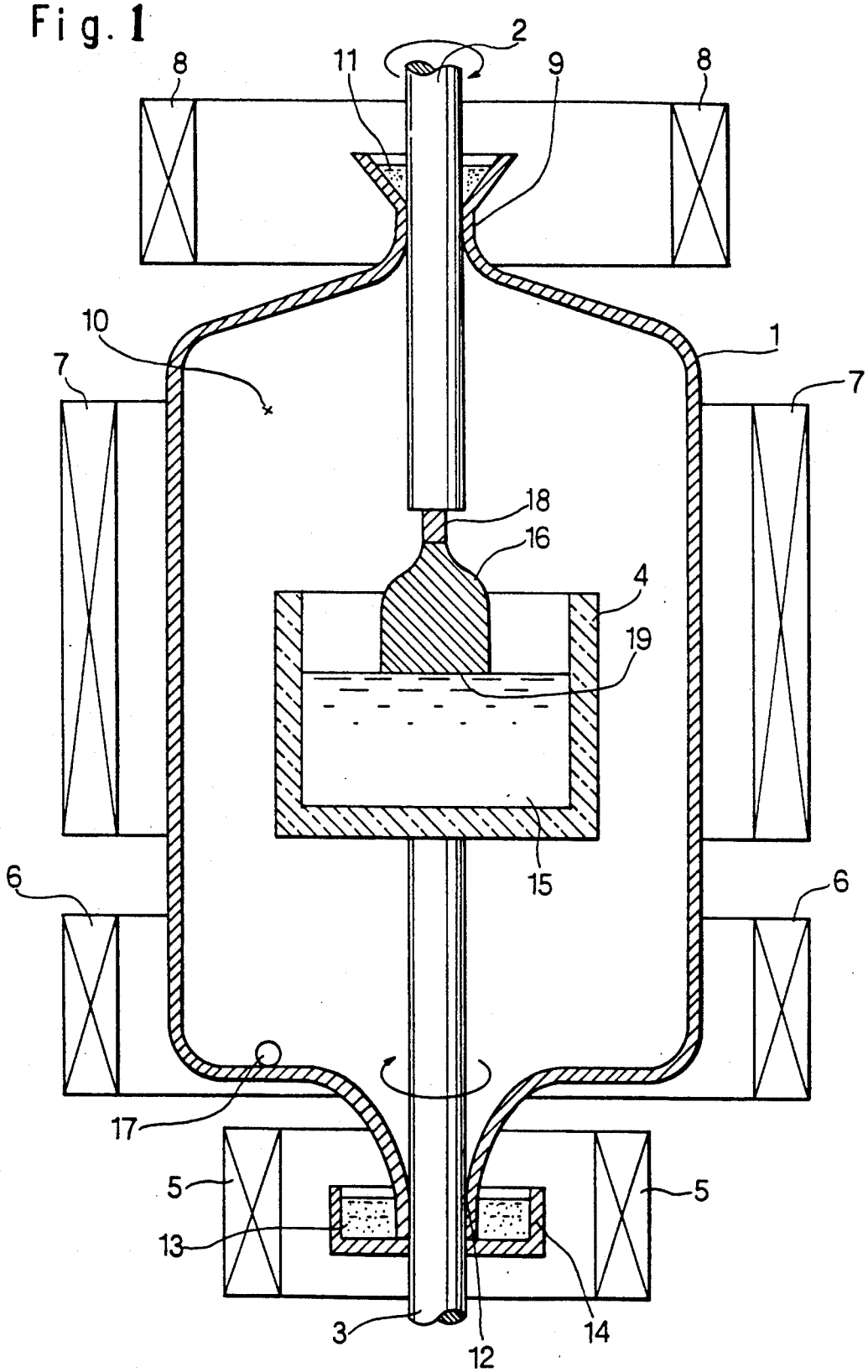
FIG. 1 is a vertical sectional view of a conventional vapor pressure control type apparatus (puller) for preparing single crystals.
Figure 5A:
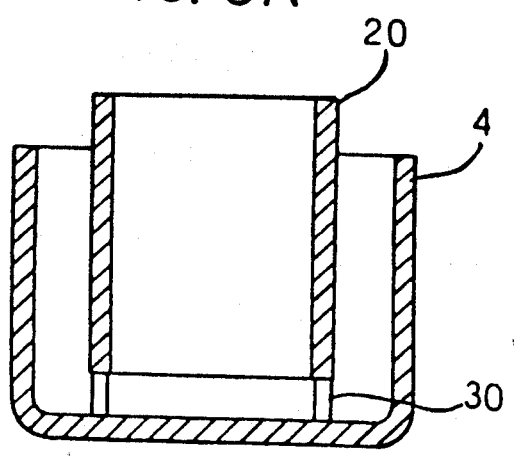
Figure 5B:
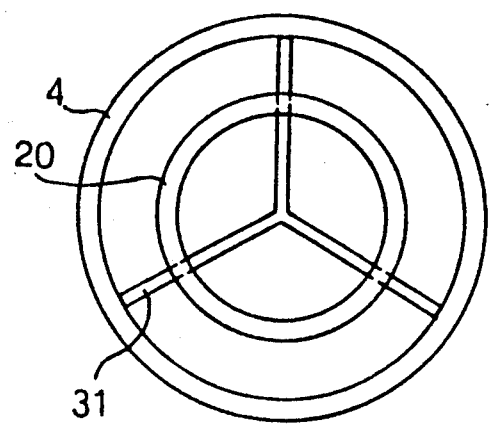
Figure 5C:
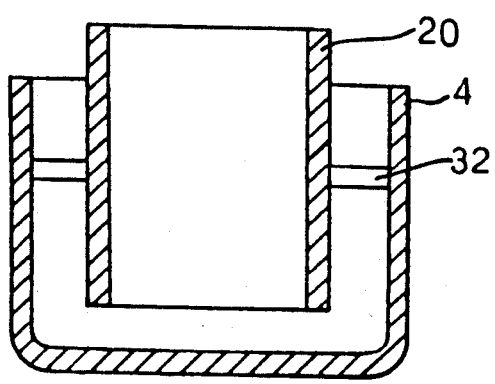
Figure 5D:
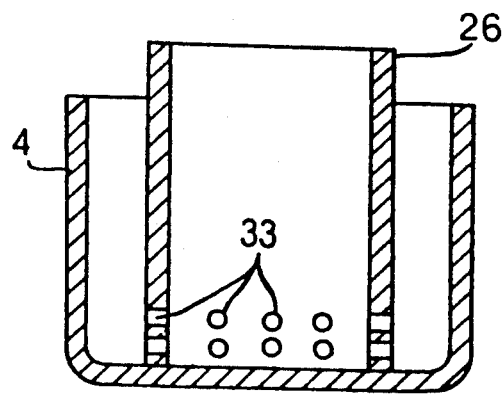

The conventional method for preparing single crystals of, for example, GaAs utilizes the apparatus shown in FIG. 1. This puller is one of the vertical type crystal growing apparatus which is mainly composed of a sealable vessel 1, an upper shaft 2, a lower shaft 3, a crucible 4 supported by the lower shaft 3 and a plurality of heaters 5 to 8 mounted around the outer wall of the vessel 1.

The upper shaft 2 is inserted in the vessel through a hole of a neck 9 formed at the top portion thereof. The neck 9 of the vessel has an inner surface being in contact with the shaft 2 so as to act as a sliding bearing. The upper portion of the neck 9 is funnel-shaped and filled with a liquid encapsulant 11 such as molten $B_2O_3$ which is heated by the heater 8 so that the inner space 10 of the vessel is completely sealed. The function of the shaft 2 is to pull the growing single crystal and to rotate it so as to assure the growth of excellent single crystal.

On the other hand, the lower shaft 3 is also inserted into the vessel 1 through a hole formed at the bottom portion thereof and the hole 12 acts as a bearing and at this portion, the inner space 10 of the vessel is also liquid-sealed with an encapsulant 13 heated by the heater 5 and contained in a circular container 14. This shaft 3 is connected to the bottom of the crucible 4, therefore, the crucible 4 as well as melt 15 of starting materials contained therein are supported by the shaft 3 and they are rotated as the shaft 3 rotates so as to allow the best quality crystal 16 to grow.

These shafts 2 and 3 can also move up and down as needed and they rotate in opposite directions with each other.

The heater 6 is provided to heat the solid element 17 of group V placed such as As at the bottom of the vessel 1 and to control the partial pressure of As in the vessel and the heater 7 serves to melt the starting material contained in the crucible 4.

When the growth operation is carried out by using such an apparatus, the starting material (for example a desired stoichiometric amount of Ga and As) is loaded into the crucible 4 and then an additional amount of As 17 is placed at the bottom of the vessel 1 to provide a desired As vapour pressure above the melt 15, which may be controlled by adjusting the heater 6. Then, $B_2O_3$ is placed at the upper and bottom portion (11 and 13) of the vessel 1 to assure the tight seal of the vessel.

The vacuum system (not shown) is turred on and an inert gas such as $N_2$, He or Ar is introduced in the vessel to remove $O_2$ and other gases detrimental to the crystal growth from the inner space 10 and to fill the space with the inert gas or to evacuate. The heaters 5 to 8 are turned on to fuse the encapsulant 11, 13 and the starting materials (Ga and As) and to evaporate solid As 17 placed at the bottom of the vessel so that the moderate temperature gradient is established within the entire vessel. The seed crystal 18 attached to the lower end of the shaft 2 is immersed in the molten ingredient (melt) by lowering the pull rod, and the shaft 2 and 3 are rotated in opposite directions with each other at a predetermined velocity. Then, the single crystal of GaAs may grow as the pull rod 2 is pulled upwardly at the desired velocity.

As to the temperature control, the apparatus shown in FIG. 1 includes four heaters 5 to 8 so as to establish a slow temperature gradient over the whole vessel 1 along its height. The first heater 5 can heat the lowest part of the vessel and melt $B_2O_3$ to seal the vessel 1 before melting the starting material. The second heater 6 heats the lower part of the vessel 1 and as mentioned above, this heater 6 serves to evaporate solid As placed at the bottom of the vessel and by adjsting this heater, the partial pressure of As in the space 10 of the vessel is maintained at a desired value. The third heater 7 heats the starting materials to form melt thereof and to hold it in liquid state during growth. The pulled crystal 16 is also heated by the heater 7, and the moderate temperature gradient may be established near the growing crystal-melt interface 19. No thermal stress remains in the growing single crystal for that reason. While the fourth heater 8 heats the upper portion of the vessel 1 where the liquid encapsulant ($B_2O_3$) is placed. The $B_2O_3$ 11 is molten before melting the solid As 17 and forming the melt 15 to ensure the tight seal at this part.

Practically, the vessel is further provided with a mechanism for opening and closing the same, a tight sealing mechanism or the like, well known to those skilled in the art and it has more complicated structure, however, such details are omitted in FIG. 1 for the sake of the simplification of the explanation.

According to the pull method using a vertical vapour pressure control type pull system, such as shown in FIG. 1, the single crystal obtained may be excellent in its stoichiometry and it has a considerably low dislocation density.

However, since the melt is not covered with the liquid encapsulant in this process, the impurity capture effect of said encapsulant can not be expected. To the contrary, if the liquid encapsulant is loaded on the surface of the melt to reduce impurities, the impurity absorption effect thereof may be obtained as already mentioned above, however, in such case, the melt and the gas atmosphere are completely separated by the encapsulant layer, and this makes the control of the vapor pressure impossible because of the discrepancy between the dissociation pressure of the melt and the As vapor pressure in the space 10.

On the other hand, the problem of controlling the vapor pressure may be considered to be solved by making the thickness of said encapsulant layer thinner. However, this is not sufficient to achieve the liquid-gas phase equilibrium since it is necessary to allow free mass transfer between the gas phase and the liquid phase to establish the equilibrium. That is, the complete equilibrium is not attained by such a procedure because of the presence of the $B_2O_3$ layer whether it may be thin or thick.

These disadvantages can be completely eliminated by the use of the apparatus according to the present invention. The apparatus of this invention is similar in the construction to that shown in FIG. 1, except that the apparatus further comprises a means for dividing the space in the crucible into two parts, which consequently acts as a means for dividing the surface area of the melt into two sections so that one section thereof may be covered with a liquid encapsulant such as $B_2O_3$ in the case of GaAs single crystal growth and the other section is exposed to the atmosphere in the vessel including gaseous As.

FIG. 2 shows the enlarged profile near the crucible 4 provided with the dividing means 20 of the present invention. For simplicity, other elements of the apparatus according to the present invention are omitted since these elements are substantially the same as those shown in FIG. 1.

In this embodiment, the means 20 for dividing the surface of the melt 15 is in the form of an elongated hollow tube. This tube 20 may be introduced in the melt 15 at any position. In FIG. 2, the tube 20 is fixed on the side wall of the crucible 4.

Since the melt surface 21 outside the tube is covered with liquid encapsulant 22 and the rest 23 (the melt surface inside the tube) is directly in contact with the gas atmosphere of the vessel 1, the impurity capture effect of the encapsulant 22 is surely expected as well as the substantial restriction of the dissociation of the melt 15 can be accomplished because of the establishment of the liquid-gas phase equilibrium.

There is no restriction in the ratio of the liquidliquid interfacial area to the gas-liquid interfacial area (i.e., the area 21 covered with the encapsulant to the encapsulant free area 23) and there is also no restriction in the position of the dividing means to be inserted into the melt through the interface. Therefore, as to the dimension of the internal section of the dividing means, there is no limit, provided that the dimension of outer section thereof is smaller than that of the crucible. In FIG. 2, the area outside the dividing means is covered with $B_2O_3$ and the rest remains free, but the converse is also possible. Therefore, the seed crystal may be pulled through with or without the encapsulant layer.

FIGS. 3 and 4 show other two embodiments of the dividing means.

In these embodiments, the means 20 is a hollow tube having a relatively large diameter and it is placed in the crucible 4 in the concentric relationship. FIGS. 3 (a) and 4(a) are vertical sections of the crucible equipped with the hollow tube 20, and on the other hand, FIGS. 3(b) and 4(b) show the plan views thereof. In FIG. 3, the liquid encapsulant 22 is charged on the surface 21 inside the tube, while the surface 23 outside the tube is free. On the contrary, the surface 23 inside the tube is free and the surface 21 outside the tube is covered with the encapsulant 22 in the embodiment shown in FIG. 4.

In these embodiments, the means for fixing or supporting the tube (the dividing means) is not shown. However, as shown in FIG. 5, the tube would be provided with legs 30 at the lower extremity (see FIG. 5(a)), or it may be supported by a supporter 31 placed on the bottom of the crucible (see FIG. 5(b)), or it may be fixed to the side wall of the crucible through arms 32 (see FIG. 5(c)). Furthermore, the dividing means may be set directly on the bottom of the crucible if it has a plurality of holes or apertures 33 on the lower side wall of the dividing means, which permit the melt to freely flow in or out of the means through the hole or the aperture (see FIG. 5(d)).

The legs 30, the supporter 31 and the arms 32 for fixing or supporting the dividing means 20 are preferably made from the material which is used to produce the vessel 1, the crucible 4 and the dividing means 20. In addition, they are selected in accordance with the ways for melting the starting material and the encapsulant such as mentioned below.

In these embodiments illustrated in FIGS. 2 to 5, the dividing means 20 is in the form of an elongated hollow tube having large or small diameter, however, the form of the section thereof is not limited to such a circular one but may be any other forms having a cross section such as rectangular, triangular or the like.

In accordance with the invention, the part of the melt surface is covered with the encapsulant by the following two ways, one of which comprises loading the starting material into the crucible; introducing a means for dividing the space in the crucible into two parts, which consequently acts as means for dividing the melt surface into two sections; partially melting it by heating; continuing the heat treatment till a part of the material is molten and the lower part of the dividing means is uniformly covered with the melt; stopping the heat treatment at the moment when a part of the starting materials still remains in its solid state, so as to prevent the increase of temperature of the melt and to avoid the escape of the volatile component accompanied by the dissociation of said component; then cooling the melt to solidify; removing the crucible from the vessel; loading the encapsulant in one of the divided sections; introducing the crucible into the vessel and again heating to form the melt and to cover one section thereof with the encapsulant.

In addition, this procedure may also be carried out by introducing the dividing means in the crucible to divide the inner space of the crucible into two parts; closely charging the starting material into at least one of the parts, in the form of powder or in the form of molded piece having the same form as that of the dividing means (the sectional dimension of the piece is slightly smaller than the inner diameter of the dividing means) or loading molded pieces into holes or apertures (33); then loading the rest of the starting material and the encapsulant; introducing the crucible in the vessel and heating it to form the melt and to cover one section of the melt surface with the molten encapsulant.

Consequently, the following effects can be expected in accordance with the process or the apparatus of this invention. Firstly, since the present invention is a vapour pressure control method using a vertical puller, the stoichiometric single crystal of III-V compound semiconductor can be prepared and the crystal obtained has a small discrepancy in its composition. Secondly, the moderate temperature gradient over the whole vessel along its height may be assured and therefore, it may be possible to obtain excellent single crystals of a small crystal defect. Moreover, the part of the melt surface is covered with a liquid encapsulant and impurities may be captured by the encapsulant and therefore, the crystal having low impurity contamination may be obtained, in particular, non-doped semi-insulating single crystal can be produced according to the invention. Finally, as in the case shown in FIGS. 2 and 3, during the single crystal growing, the vicinity of the crystal growth interface is covered with $B_2O_3$ and as a result, the growing crystal is not directly affected by the fluctuation of the vapor pressure of group V element. Consequently, the steady crystal growth may be accomplished.

The process for preparing single crystal according to the invention will now be described more in concretely by the following non-limitative example.

EXAMPLE 1

This example illustrates the process for preparing InAs single crystal. The apparatus used is similar to the one shown in FIG. 1, except that the dividing means such as shown in FIG. 2 is provided. The tube, vessel and crucible made of pyrolytic boron nitride (pBN) are used.

The crystal growth was carried out at the vicinity of 943° C. at which the InAs is melted. The temperature at the bottom is controlled by the heater 6 so that the partial pressure of As in the vessel is equal to the dissociation pressure of InAs (0.33 atm.). The rotating number of the upper and lower shafts was set at 1 to 10 rpm and the pull velocity (growth velocity) was set at 3 to 10 mm/hr. $B_2O_3$ is used as the liquid encapsulant.

Under these condition, the resulting single crystal has a diameter of 50 mm, a length of 150 mm and has the dislocation density less than 500/cm². It was found that there is no composition discrepancy in the crystal obtained.

The resistivity of the crystal is in the range of from $10^3$ to $10^9$ ohm.cm and is useful for the semi-insulating semiconductor. The content of impurities is also very low.

We claim:

1. A method for growing single crystal of a dissociative compound, comprising the steps of:

pulling a single crystal of a dissociative compound upwardly from a central portion of an upper surface of a first melt of said dissociative compound in a crucible under the conditions that a first, central, fractional part of an area of said upper surface of said first melt is covered by and is in direct surface-to-surface contact with a second melt of $B_2O_3$ and said second melt surrounds and contacts the periphery of the single crystal that is being pulled from said first melt, a second, peripheral, functional part of the area of said upper surface of said first melt is free of direct contact with said second melt, the zone of said first melt below said second fractional part of the area of said upper surface is to contact with pressurized gas of a volatile component of said dissociative compound and the zone of said first melt that is below said second fractional part of said upper surface is in fluid flow communicatioin with the zone of said first melt that is below said first fractional part of said upper surface.

* * * * *

UNITED STATES PATENT AND TRADEMARK OFFICE
CERTIFICATE OF CORRECTION

PATENT NO. : 5,145,550

DATED : September 8, 1992

INVENTOR(S) : Koji TADA, ET AL

It is certified that error appears in the above-identified patent and that said Letters Patent is hereby corrected as shown below:

In the drawings, Fig. 1 should be labelled "Prior Art"

Column 8, line 47: delete "in"

Column 8, line 60: delete "tc," and insert -- to --

Column 10, claim 1, line 21, delete "municatioin" and insert --munication--

Signed and Sealed this

Sixteenth Day of November, 1993

Attest:

BRUCE LEHMAN

Attesting Officer     Commissioner of Patents and Trademarks